(12) United States Patent
Sirocka et al.

(10) Patent No.: US 9,875,993 B2
(45) Date of Patent: Jan. 23, 2018

(54) SEMICONDUCTOR DEVICES WITH DUPLICATED DIE BOND PADS AND ASSOCIATED DEVICE PACKAGES AND METHODS OF MANUFACTURE

(71) Applicant: Micron Technology, Inc., Boise, ID (US)

(72) Inventors: Nathan J. Sirocka, Auburn, CA (US); Trismardawi Tanadi, Sacramento, CA (US); Andrew D. Proescholdt, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/995,925

(22) Filed: Jan. 14, 2016

(65) Prior Publication Data

US 2017/0207195 A1   Jul. 20, 2017

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06506* (2013.01); *H01L 2225/06517* (2013.01); *H01L 2225/06582* (2013.01)

(58) Field of Classification Search
CPC ................. H01L 25/0657; H01L 25/50; H01L 2225/06506; H01L 2225/06517; H01L 2225/06582
See application file for complete search history.

(56) References Cited

U.S. PATENT DOCUMENTS

| 2009/0046183 A1 | 2/2009 | Nishida et al. |
| 2010/0117217 A1 | 5/2010 | Park et al. |
| 2012/0133055 A1* | 5/2012 | Machida ................. H01L 24/06 257/777 |
| 2013/0020720 A1* | 1/2013 | Kim ..................... H01L 23/3135 257/774 |

(Continued)

OTHER PUBLICATIONS

International Application No. PCT/US2017/012383—International Search Report and Written Opinion, dated May 31, 2017, 17 pages.

(Continued)

*Primary Examiner* — Nathan W Ha
(74) *Attorney, Agent, or Firm* — Perkins Coie LLP (57) ABSTRACT

Semiconductor devices with duplicated die bond pads and associated device packages and methods of manufacture are disclosed herein. In one embodiment, a semiconductor device package includes a plurality of package contacts and a semiconductor die having a plurality of first die bond pads, a plurality of second die bond pads, and a plurality of duplicate die bond pads having the same pin assignments as the first die bond pads. The semiconductor die further includes an integrated circuit operably coupled to the package contacts via the plurality of first die bond pads and either the second die bond pads or the duplicate die bond pads, but not both. The integrated circuit is configured to be programmed into one of (1) a first pad state in which the first and second die bond pads are enabled for use with the package contacts and (2) a second pad state in which the first and duplicate die bond pads are enabled for use with the package contacts.

16 Claims, 6 Drawing Sheets

(56) References Cited

U.S. PATENT DOCUMENTS

| | | | |
|---|---|---|---|
| 2015/0008567 A1 | 1/2015 | Pham et al. | |
| 2015/0108663 A1* | 4/2015 | Hong | H01L 25/0657 257/777 |
| 2015/0303175 A1* | 10/2015 | Kim | H01L 25/0657 257/777 |
| 2015/0311185 A1* | 10/2015 | Ng | H01L 25/18 257/784 |
| 2015/0311186 A1* | 10/2015 | Ye | H01L 25/18 257/777 |
| 2015/0325560 A1 | 11/2015 | Fai et al. | |
| 2016/0043026 A1* | 2/2016 | Yang | H01L 23/49838 257/48 |
| 2016/0372448 A1* | 12/2016 | Yazdani | H01L 23/66 |
| 2017/0025385 A1* | 1/2017 | Song | H01L 25/0657 |
| 2017/0033081 A1* | 2/2017 | Yoo | H01L 25/0657 |

OTHER PUBLICATIONS

TW Patent Application No. 106101128—Taiwanese Office Action, dated Oct. 3, 2017, with English Translation, 15 pages.

\* cited by examiner

SEMICONDUCTOR DEVICES WITH DUPLICATED DIE BOND PADS AND ASSOCIATED DEVICE PACKAGES AND METHODS OF MANUFACTURE

TECHNICAL FIELD

The disclosed embodiments relate to semiconductor devices, including semiconductor device packages, such as memory device packages, having duplicate die bond pads that are selectively coupled to external package contacts.

BACKGROUND

Figure 1A:
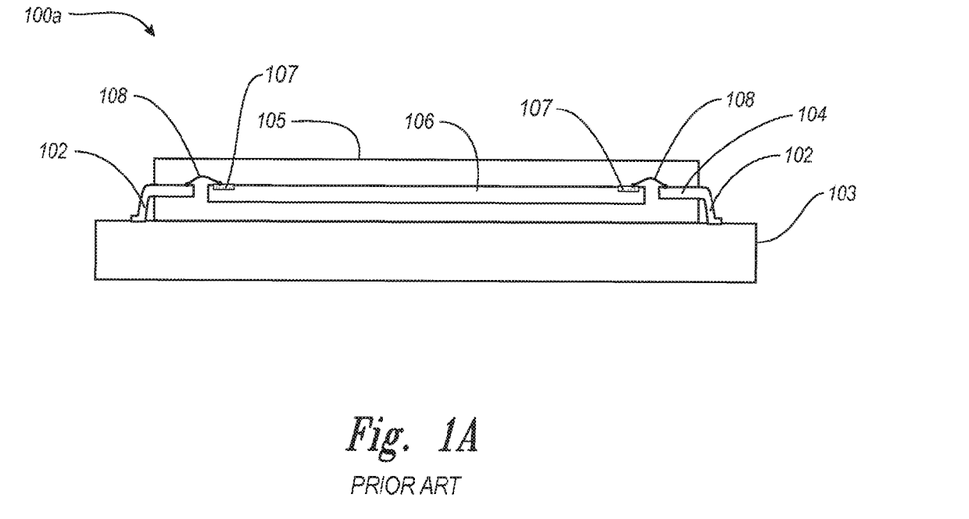
FIGS. 1A and 1B are cross-sectional views of memory device packages in accordance with prior art.

A memory device package typically includes a semiconductor memory die encased in a plastic or ceramic casing, and package contacts that enable the device package to be electrically connected to a printed circuit board (PCB). Memory device packages can have package contacts that come in many different forms. FIG. 1A shows one device package 100a having package contacts in the form of metal leads 102 that are connected to an underlying PCB 103. The metal leads 102 are arranged in a lead frame 104 and extend through a package casing 105 where they connect to a memory die 106 within the package casing 105. Wirebonds 108 electrically connect individual leads 102 to individual die bond pads 107 on an upper side of the memory die 106, thereby electrically connecting the memory die 106 to the PCB 103. The device package 100a shown in FIG. 1A is commonly referred to as a small outline integrated circuit (SOIC) package.

Figure 1B:
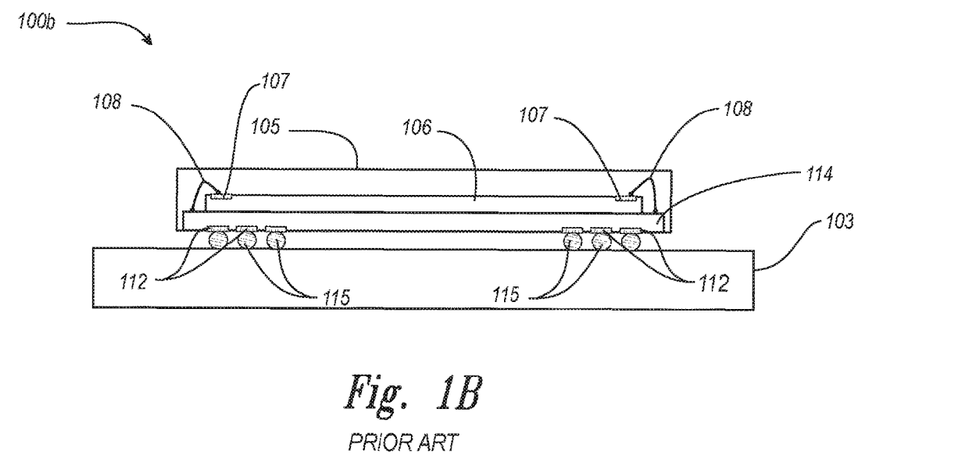

FIG. 1B shows a different memory device package 100b having package contacts in the form of contact pads 112 bonded to the PCB 103 generally beneath the device package 100b via metal solder bumps 115. The contact pads 112 are formed on a support substrate 114 that carries the memory die 106. The support substrate 114 includes multiple levels of conductive traces (not shown) that connect the contact pads 112 to the corresponding wirebonds 108 and die bond pads 109 on the memory die 106. The device package 100b shown in FIG. 1B is commonly referred to as a ball grid array (BGA) package.

One difference between the BGA package 100b of FIG. 1B and the SOIC package 100a of FIG. 1A is that the BGA package uses the support substrate 114 in lieu of the metal leads 102 to route electrical connections. An advantage that this provides is a more compact footprint than the SOIC package 100a due to the package contact pads 112 being within planform of the memory die 106. Additionally, it is easier to route electrical connections using the substrate traces of the BGA package 100b rather than the metal leads 102, which can only be placed along the perimeter of the die 106. A disadvantage of the BGA configuration, however, is that the support substrate 114 is more expensive to manufacture than the lead frame 104, and thus increases the relative cost of the BGA package 100b. To keep manufacturing costs low, some device manufactures choose to use an SOIC package, while other manufactures choose a BGA design for a reduced footprint and less complicated die bond pad layout. In either case, the memory die 106 of the BGA and SOIC packages can be substantially identical, except for the layout of the corresponding die bond pads 107 and 109.

DETAILED DESCRIPTION

Specific details of various embodiments of semiconductor devices with duplicated bond pads are described herein, along with related methods, devices, and systems. The term "semiconductor device" generally refers to a solid-state device that includes one or more semiconductor materials. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

A semiconductor device can also include a "semiconductor device package" comprising one or more semiconductor dies incorporated into the package. A semiconductor device package can include a housing or casing that partially or completely encapsulates one or more semiconductor devices. A semiconductor device package can also include an interposer substrate that carries one or more semiconductor devices and is attached to or otherwise incorporated into the package. The term "semiconductor device assembly" can refer to an assembly of one or more semiconductor devices, semiconductor device packages, and/or substrates (e.g., interposer, support, or other suitable substrates).

In the illustrated embodiments described below, semiconductor devices are described in the context of memory devices and memory device packages that include such devices. The invention, however, is not limited to memory dies and memory device packages that include such memory dies. For example, some embodiments of semiconductor device assemblies and packages can include processors, logic dies, light-emitting dies, analog circuit dies, etc. Further, a person skilled in the relevant art will also understand that the new technology may have additional embodiments and that the technology may be practiced without several of the details of the embodiments described below with reference to FIGS. 2-7.

As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 2:
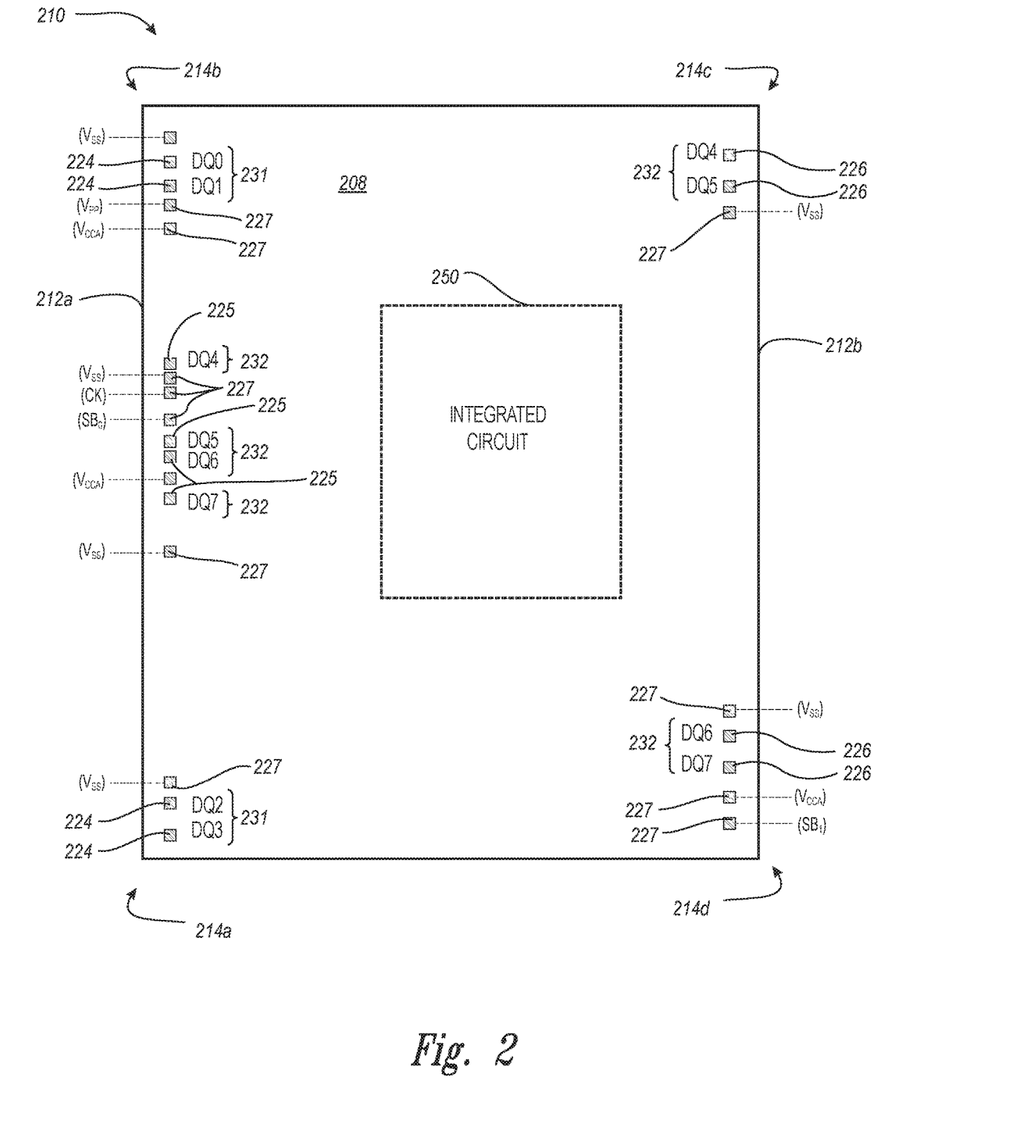
FIG. 2 is a top view of a memory die configured in accordance with an embodiment of the present technology.

FIG. 2 is a top view of a memory die 210 configured in accordance with an embodiment of the present technology. The memory die 210 includes an active surface 208 and separate groups of first die bond pads 224 ("first die pads 224"), second die bond pads 225 ("second die pads 225"), and third die bond pads 226 ("duplicate die pads 226") formed on the active surface 208 within the perimeter of the semiconductor die 210. The first die pads 224 are proximate to first and second die corner regions 214a and 214b along a first die edge 212a. The second die pads 225 are positioned medially along the first edge 212a between the first and second die corner regions 214a and 214b. The duplicate die pads 226 are proximate to third and fourth die corner regions 214c and 214d along a second die edge 212b opposite the first die edge 212a.

The first die pads 224 have dedicated first pin assignments 231, the second die pads 225 have dedicated second pin assignments 232, and the duplicate die pads 226 have the same dedicated second pin assignments 232 (i.e., duplicated pin assignments) as the second bond pads 225. The first and second pin assignments 231 and 232 correspond to the assignments of specific pads, traces, or other connection sites on a support substrate (not shown), such as a PCB, to which a device package containing the memory die 210 is ultimately attached. In the illustrated embodiment, the first and second pin assignments 231 include input/output (I/O) or DQ pins. More specifically, the first pin assignments 231 include DQ0-DQ3 pins, and the second pin assignments 232 include DQ4-DQ7 pins. In use, the DQ pins can input and/or output data over internal data lines (not shown) of the memory die 210 for reading, programming (e.g., writing), or otherwise accessing data from the memory die 210. The memory die 210 further includes additional die bond pads 227 having other dedicated pin assignments. For example, in the embodiment illustrated in FIG. 2, these other pin assignments include $V_{SS}$, $V_{PP}$, $V_{CCA}$ pins for proving power supply and reference voltages, pin CK for providing a clock signal, and pins $SB_0$ and $SB1_1$ for providing chip select signals. Although not shown in the illustrated embodiments for purposes of clarity, the memory die 210 can include additional die bond pads having additional pins assignments, such as reset and other pins. In these and other embodiments, some of the die bond pads 227 may be omitted, one or both of the pin assignments 231 and 232 may be greater or fewer in number, and/or one or both of the pin assignments 231 and 232 may be assigned to additional or alternate functions (e.g., control signaling functions in addition to or in lieu of data line communication).

The memory die 210 includes various types of semiconductor components and functional features. In the embodiment illustrated FIG. 2, the memory die 210 includes an integrated circuit 250 (shown schematically) having non-volatile memory and related circuitry that together form a NOR flash-based memory. In other embodiments, the memory die can include semiconductor components and functional features that form other types of memory devices such as NAND flash-based memory, dynamic random-access memory (DRAM), static random-access memory (SRAM), and/or other forms of integrated circuit memory. In these and other embodiments, the memory die 210 can include die bond pads having dedicated pin assignments for a specific memory configuration. For example, a DRAM die can include die bond pads assigned to command, control, and address pins.

In operation, the integrated circuit 250 is configured to be programmed into at least a first pad state or a second pad state. In the first pad state, the integrated circuit enables the first and second die pads 224 and 225 for use. In the second pad state, the integrated circuit 250 enables the first and duplicate die pads 224 and 226 for use.

Figure 3A:
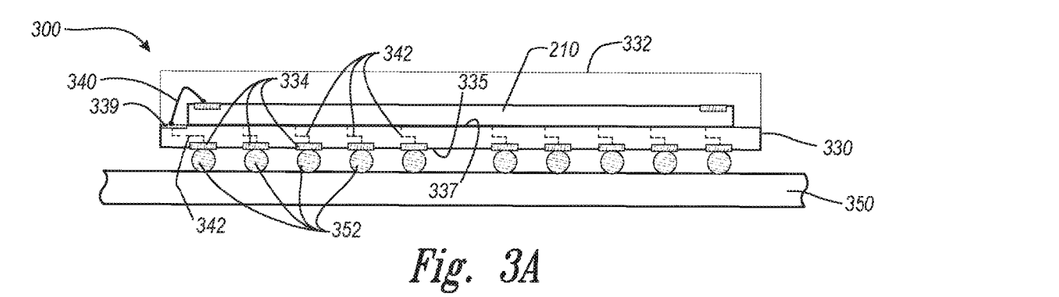
FIG. 3A is a cross-sectional side view and FIG. 3B is a top view of a memory device package that includes the memory die configured in a first pad state in accordance with an embodiment of the present technology.
Figure 3B:
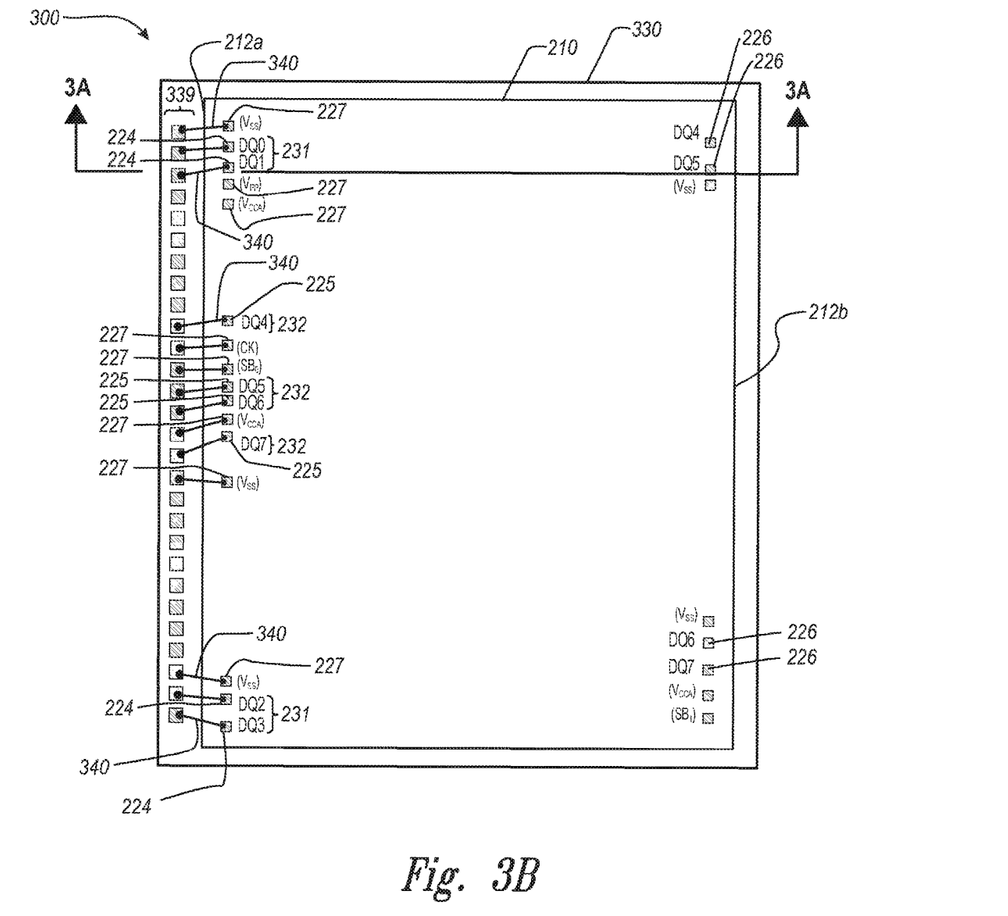

FIG. 3A is a cross-sectional side view and FIG. 3B is a top view of a memory device package 300 (e.g., a BGA package) that includes the memory die 210 configured in the first pad state. Referring to FIG. 3A, the memory device package 300 includes a package substrate 330 carrying the memory die 210, a package casing 332 at least partially encapsulating or otherwise housing the memory die 210, and a plurality of package contacts 334 (e.g., bond pads) adjacent a bottom side 335 of the support substrate 330. The support substrate 330 includes a top side 337 opposite the bottom side 335, a plurality of intermediary bond pads 339 coupled to the memory die 210 via individual wirebonds 340 (only one wirebond 340 and corresponding intermediary bond pad 339 is visible in FIG. 3A), and a plurality of conductive traces 342 (shown schematically) coupling the intermediary bond pads 339 with corresponding package contacts 334. The package contacts 334 can be bonded to corresponding contacts (not shown) on a PCB 350 or other suitable substrate via, e.g., solder bumps 352.

Referring to FIG. 3B, the package casing 332 (FIG. 3A) has been removed from the device package 300 (FIG. 3A) to show the connections between the intermediary bond pads 339 and the memory die 210 in further detail. More specifically, the intermediary bond pads 339 are connected to the first and second die pads 224 and 225 via the individual wirebonds 340. The wirebonds 340 also connect the intermediary bond pads 339 to the other die pads 227 located along the first edge 212a.

In the first pad state shown in FIGS. 3A and 3B, the die pads 224, 225, and 227 along the first die edge 212a are enabled for use. In one aspect of this embodiment, the memory device package 300 can have a reduced footprint because the wirebonds 340 are only along the first die edge 212a and not along the second die edge 212b unlike other device packages requiring wirebonds at opposite die edges. In a related aspect of this embodiment, the length of the bond wires 340 is minimized due to the close proximity of the intermediary bond pads 339 to the corresponding die pads 224, 225 and 227. Minimizing the length of the bond wires 340 can, for example, reduce electrical resistance, improve signal quality, reduce or eliminate timing skew, and/or provide other improvements in electrical performance (e.g., increased signal processing speed).

Figure 4A:
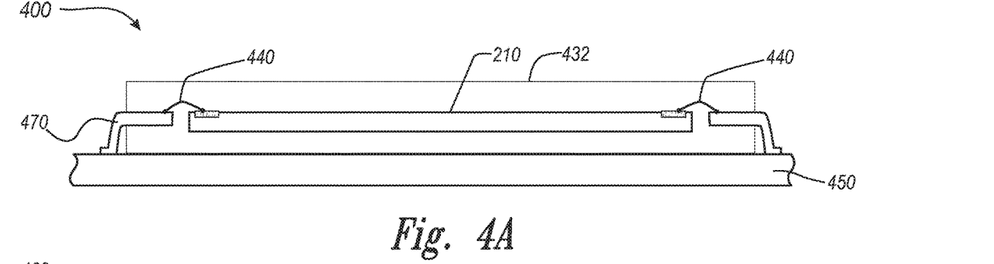
FIG. 4A is a cross-sectional side view and FIG. 4B is a top view of a memory device package that includes the memory die configured in a first pad state in accordance with another embodiment of the present technology.
Figure 4B:
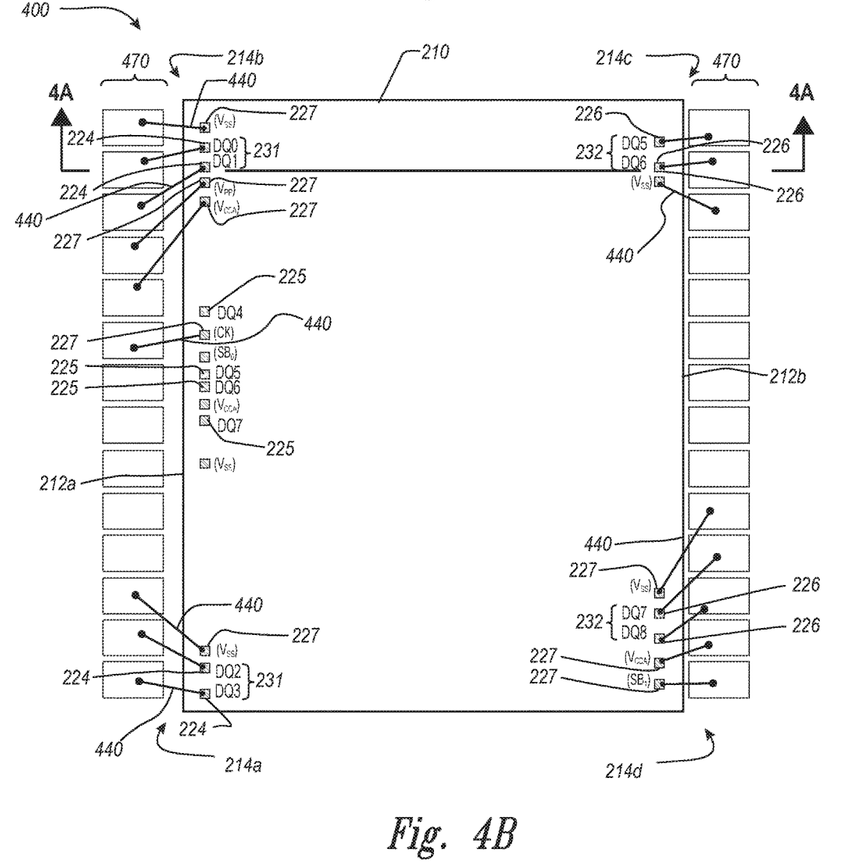

FIG. 4A is a cross-sectional side view and FIG. 4B is a top view of a memory device package 400 (e.g., an SOIC package) that includes the memory die 210 configured in the second pad state. Referring to FIG. 4A, the memory device package 400 includes a package casing 432 at least partially encapsulating the memory die 210 and a plurality of package contacts, or metal leads 470, bonded to substrate contacts (not shown) on a PCB 450 or other suitable support substrate. The metal leads 470 extend through the package casing 432 and are wirebonded to the memory die 210 via individual wirebonds 440.

Referring to FIG. 4B, the package casing 432 (FIG. 4A) has been removed from the device package 400 to show the connections between the metal leads 470 and the memory die 210 in further detail. More specifically, the metal leads 470 are connected to the first and duplicate die pads 224 and 226 via the individual wirebonds 440. The wirebonds 440 also connect the metal leads 470 to individual ones of the die bond pads 227 located proximate the die corner regions 214a-d and one of the die bond pads 227 along the first edge 212a assigned to the clock pin CK.

In the second pad state shown in FIGS. 4A and 4B, the die pads 224, 226, and 227 proximate the corner regions 214a-d are enabled for use. In one aspect of this embodiment, the memory die 210 of the device package 400 is identical to the memory die 210 of the device package 300 (FIGS. 3A and 3B). Thus, one advantage of the memory die 210 and other semiconductor devices configured in accordance with the various embodiments is that they give device manufactures the ability to accommodate different packaging types by simply programming the device to a particular pad state. This, in turn, simplifies device manufacturing and reduces related costs.

Figure 5:
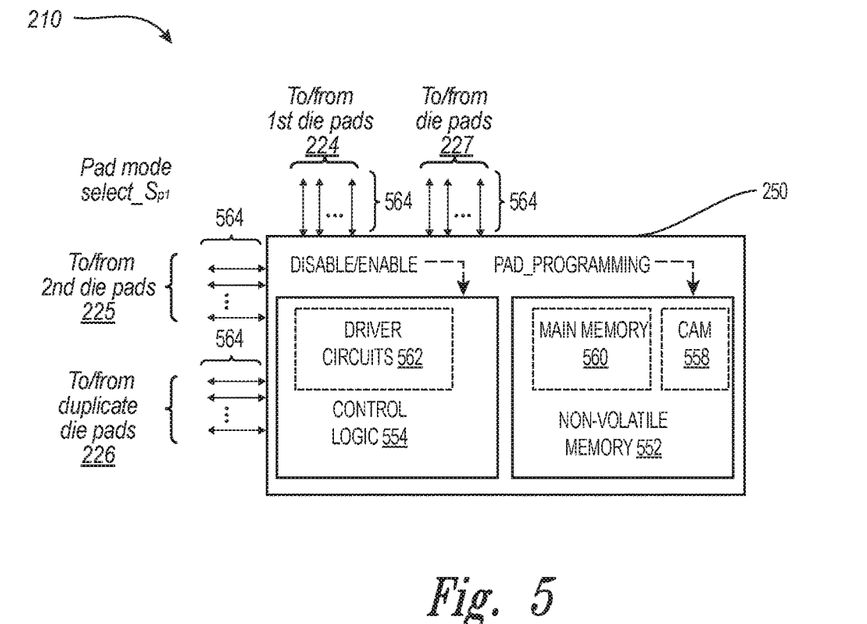
FIG. 5 is a schematic diagram showing an integrated circuit of a memory die configured in accordance with an embodiment of the present technology.

FIG. 5 is a schematic diagram of the memory die 210 showing the integrated circuit 250 configured in accordance with an embodiment of the present technology. The integrated circuit 250 includes a non-volatile memory 552, control logic 554 operably coupled to the non-volatile memory 552, and a plurality of conductive lines 564 (e.g., traces and/or buried signal lines) operably coupling each of the individual die pads 224-227 to the control logic 554 and/or directly to the non-volatile memory 552. Each of the conductive lines 564 is associated with one of the pin assignments shown in FIG. 2.

In the embodiment illustrated in FIG. 5, the non-volatile memory 552 includes a region of content-addressable memory (CAM) 558 ("CAM region 558"). In one embodiment, the CAM region 558 can be a portion of memory separate from a main memory module 560 containing, e.g., the main memory pages, blocks, etc. of the memory die 210. In another embodiment, a different type of non-volatile memory or a dedicated portion of the main memory module can be used in lieu of the CAM region 558.

In operation, the CAM region 558 is configured to store a value (e.g., a multiple digit binary value) indicative of a particular pad state. In one embodiment, the CAM region 558 can store a binary value of "10" indicating that the memory die 210 is in the first pad state (i.e., the first and second die pads 224 and 225 are enabled for use) and a binary value of "01" indicating that the memory die is in the second pad state (i.e., the first and duplicate die pads 224 and 226 are enabled for use). In some embodiments, the CAM region 558 can store values corresponding to additional or alternate pad states. For example, in one embodiment, the CAM region 558 can store a binary value of "00" indicating a third pad state in which only the first die pads 224 are enabled for use. In such an embodiment, the third pad state can be used for testing the integrated circuit 250 before finally programming the memory die 210 into the first pad state, the second pad state, or another pad state. In one embodiment, the CAM region 558 can be programmed via a pad programming signal received over one or multiples ones of the die bond pads 224-227.

The control logic 554 can include, for example, one or more multiplexers, decoders, buffers, address registers, data out/data in registers, etc. for operating the non-volatile memory 552. In the embodiment illustrated in FIG. 5, the control logic 554 includes a plurality of driver circuits 562 configured to drive signals over at least some of the individual die pads 224-226. In one embodiment, the corresponding driver circuits can be enabled/disabled according to the pad state of the second and duplicate bond pads 225 and 226, i.e., according to whether the device package is programmed for a BGA configuration or an SOIC configuration. The driver circuits associated with the first die pads 224, however, are enabled in both of the first and second pad states.

Figure 6:
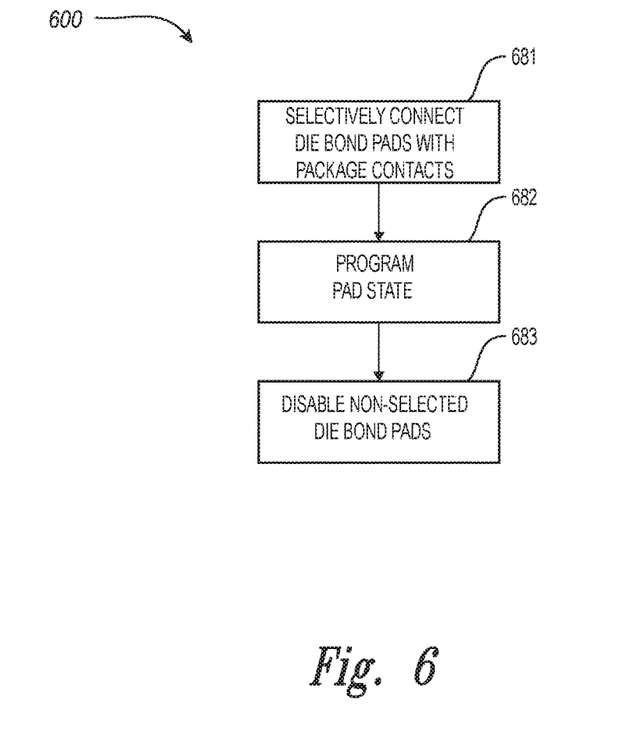
FIG. 6 is a block diagram illustrating a method of manufacturing a semiconductor device package in accordance with an embodiment of the present technology.

FIG. 6 is a block diagram illustrating a method 600 of manufacturing a semiconductor device package in accordance with an embodiment of the present technology. The method includes selectively connecting individual ones of the die bond pads 224-227 to corresponding package contacts of a device package (block 681), such as the package contacts of one of the device packages 300 and 400 shown in FIGS. 3A and 4A, respectively. More specifically, the first die bond pads 224 can be connected to a first set of the package contacts of the device package, while only one group of either the second die pads 225 or the duplicate die pads 226 is connected to another set of the package contacts.

The method 600 further includes programming a pad state of the memory die 210 (block 682). For example, the integrated circuit 250 can be programmed via the CAM region 558 of FIG. 5. When the CAM region 558 stores a value indicative of a first pad state, the second die bond pads 225 are enabled for use while the duplicate die bond pads 226 are not enabled. When the CAM region 558 stores a value indicative of a second pad state, the duplicate die bond pads 226 are enabled for use while the second die bond pads 225 are not enabled. In some embodiments, the method 600 can include disabling the non-selected die bond pads (block 683). For example, as discussed above, the non-selected die bond pads can be disabled by powering down, disconnecting, or otherwise suspending operation of their corresponding driver circuits.

In certain embodiments, the pad state of the memory die 210 is programmed before a die packaging stage using, e.g., a probe card that directly contacts one or more the die pads 224-227 before a device packaging stage. In additional or alternate embodiments, the pad state is programmed into the memory die 210 during or after a packaging stage. In one embodiment, the memory die 210 is permanently programmed by the device manufacturer, and the memory die 210 cannot be re-programmed by the device customer and/or the device manufacturer. In other embodiments, the memory die 210 can be programmed and/or re-programmed by the device manufacturer and/or the device customer.

Figure 7:
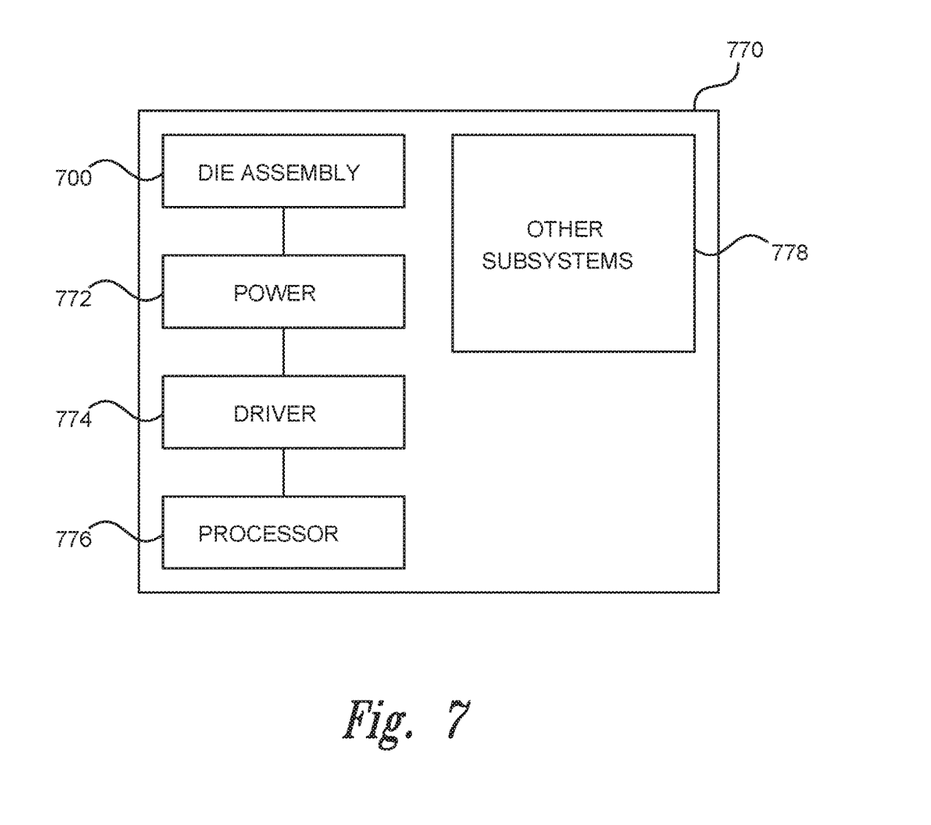
FIG. 7 is a schematic view of a system that includes a semiconductor device in accordance with embodiments of the present technology.

Any one of the semiconductor devices and semiconductor device packages described above with reference to FIGS. 2-6 can be incorporated into any of a myriad of larger and/or more complex systems, a representative example of which is system 770 shown schematically in FIG. 7. The system 770 can include a semiconductor device 700, a power source 772, a driver 774, a processor 776, and/or other subsystems or components 778. The semiconductor device 700 can include features generally similar to those of the semiconductor devices described above, as well as additional features such as heat transfer structures that enhance heat dissipation. The resulting system 770 can perform any of a wide variety of functions such as memory storage, data processing, and/or other suitable functions. Accordingly, representative systems 770 can include, without limitation, hand-held devices (e.g., mobile phones, tablets, digital readers, and digital audio players), computers, vehicle and other machines, and appliances. Components of the system 770 may be housed in a single unit or distributed over multiple, interconnected units (e.g., through a communications network). The components of the system 770 can also include remote devices and any of a wide variety of computer readable media.

From the foregoing, it will be appreciated that specific embodiments of the technology have been described herein for purposes of illustration but that various modifications may be made without deviating from the disclosure. For example, in some embodiments, the various die bond pads of the memory die can be positioned and/or programmed into certain states for accommodating other types of device package configurations in addition to or in lieu of BGA and/or SOIC configurations. Such device package configurations can include, for example, dual in-line packages (DIP), pin grid arrays (PGA), plastic leaded chip carriers (PLCC), quad flat packages (QFP), and/or thin small outline packages (TSOP) configurations. Further, semiconductor dies configured in accordance with certain embodiments of the present technology can include one or more additional sets of die bond pads having pin assignments (e.g., triplicate pad assignments) dedicated to the same pin assignments as the second and duplicate die pads 225 and 226 (FIG. 2). In at least some of these embodiments, the corresponding die bond pads can be arranged to accommodate three or more different types of package configurations. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device package, comprising:
a plurality of package contacts; and
a semiconductor die, including—
  a plurality of first die bond pads having dedicated first pin assignments,
  a plurality of second die bond pads having dedicated second pin assignments,
  a plurality of duplicate die bond pads having the same dedicated second pin assignments as the second die bond pads, and
  an integrated circuit operably coupled to the package contacts via the plurality of first die bond pads and either the second die bond pads or the duplicate die bond pads, but not both,
wherein the integrated circuit is configured to be programmed into one of (1) a first pad state in which the first and second die bond pads are enabled for use with the package contacts or (2) a second pad state in which the first and duplicate die bond pads are enabled for use with the package contacts.

2. The semiconductor device package of claim 1 wherein the integrated circuit is further configured to:
disable the duplicate die bond pads in the first pad state; or
disable the second die bond pads in the second pad state.

3. The semiconductor device package of claim 1 wherein the semiconductor die further includes a perimeter and first and second die edges at opposite sides of the perimeter, and wherein the first and second die bond pads are adjacent the first die edge, and wherein the duplicate die bond pads are adjacent the second die edge.

4. The semiconductor device package of claim 3, further comprising a package substrate carrying the semiconductor die, wherein:
the package substrate includes a plurality of intermediate bond pads wirebonded to corresponding ones of the first and second die bond pads, and a plurality of conductive traces electrically coupling the intermediate bond pads to the package contacts; and
the package contacts are formed on the package substrate beneath the semiconductor die.

5. The semiconductor device package of claim 4 wherein the first die bond pads are proximate to first and second die corner regions adjacent the first edge, the second die bond pads are positioned medially along the first edge between the first and second die corner regions, and the duplicate die bond pads are proximate to third and fourth die corner regions adjacent the second die edge.

6. The semiconductor device package of claim 1, further comprising a casing at least partially encapsulating the semiconductor die, wherein the package contacts include metal leads extending through the package casing and wirebonded to corresponding ones of the first die bond pads and the duplicate die bond pads.

7. The semiconductor device package of claim 1 wherein the integrated circuit includes non-volatile memory, and wherein the non-volatile memory is configured to store at least one of a first value indicative of the first pad state and a second value indicative of the second pad state.

8. The semiconductor device package of claim 7 wherein the non-volatile memory is further configured to store a value indicative of a third pad state in which both the second die bond pads and the duplicate die bond pads are disabled for use.

9. The semiconductor device package of claim 1 wherein the integrated circuit includes a memory component and a plurality of data lines for accessing the memory component, and wherein each of the first, second, and duplicate pin assignments is associated with one of the data lines.

10. A semiconductor device, comprising:
a package casing;
a plurality of package contacts along at least one side of the package casing; and
a memory die at least partially encased in the package casing, wherein the memory die includes an active surface and first, second, and third groups of die bond pads positioned at different regions of the active surface, wherein—
  the first and second groups of die bond pads are electrically coupled to corresponding ones of the package contacts,
  the third group of die bond pads is electrically disconnected from the package contacts,
  the first group of die bond pads has first pin assignments,
  the second group of die bond pads has second pin assignments that are different than the first pin assignments,
  the third group of die bond pads has third pin assignments that are the same as the second pin assignments, and
  the memory die is configured to be programmed into (1) a first pad state in which the first and second groups of die bond pads are enabled for use and (2) a second pad state in which the first and third groups of die bond pads are enabled for use.

11. The semiconductor device of claim 10 wherein:
the package contacts are arrayed in a ball grid array (BGA) configuration; and
the memory die is configured to be programmed into (1) the first pad state in which the first and second groups of die bond pads are enabled for use in the BGA configuration and (2) the second pad state in which the first and third groups of die bond pads are enabled for use in a configuration of package contacts other than the BGA configuration.

12. The semiconductor device of claim 10 wherein:

the package contacts are arrayed in a small outline integrated circuit (SOIC) configuration; and the memory die is configured to be programmed into (1) the first pad state in which the first and second groups of die bond pads are enabled for use in the SOIC configuration and (2) the second pad state in which the first and third groups of die bond pads are enabled for use in a configuration other than the SOIC configuration.

13. A semiconductor device comprising:

an active surface and first, second, and third groups of die bond pads positioned at different regions of the active surface, wherein— the first group of die bond pads has first pin assignments, the second group of die bond pads has second pin assignments that are different from the first pin assignments, and the third group of die bond pads has third pin assignments that are the same as the second pin assignments, wherein the semiconductor device is configured to selectively enable one of (1) the second group of bond pads and (2) the third group of bond pads.

14. The semiconductor device of claim 13 further comprising a semiconductor device package including a first group of package contacts coupled to the first group of bond pads, and a second group of package contacts coupled to the enabled one of (1) the second group of bond pads and (2) the third group of bond pads.

15. The semiconductor device of claim 14 wherein package contacts include metal leads extending through the package casing and wirebonded to the first and third group of die bond pads.

16. The semiconductor device of claim 14 wherein package contacts include metal bumps beneath the semiconductor die and electrically coupled to the first and third groups of die bond pads.

* * * * *